US008027216B2

(12) United States Patent
Fukuda et al.

(10) Patent No.: US 8,027,216 B2
(45) Date of Patent: Sep. 27, 2011

(54) SEMICONDUCTOR MEMORY DEVICE

(75) Inventors: Ryo Fukuda, Yokohama (JP); Yohji Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 208 days.

(21) Appl. No.: 12/550,663

(22) Filed: Aug. 31, 2009

(65) Prior Publication Data

US 2010/0074042 A1    Mar. 25, 2010

(30) Foreign Application Priority Data

Sep. 24, 2008  (JP) ................. 2008-244454

(51) Int. Cl.
*G11C 7/00* (2006.01)
*G11C 8/00* (2006.01)
(52) U.S. Cl. ........................ 365/222; 365/236
(58) Field of Classification Search ............ 365/222, 365/236, 238, 201
See application file for complete search history.

(56) References Cited

U.S. PATENT DOCUMENTS

| | | | | |
|---|---|---|---|---|
| 5,479,372 | A * | 12/1995 | Sato et al. | 365/222 |
| 6,741,515 | B2 * | 5/2004 | Lazar et al. | 365/222 |
| 7,362,642 | B2 * | 4/2008 | Miyamoto et al. | 365/222 |
| 7,675,800 | B2 * | 3/2010 | Kawabata | 365/222 |

FOREIGN PATENT DOCUMENTS

| | | |
|---|---|---|
| JP | 9-265784 | 10/1997 |
| JP | 2003-7051 | 1/2003 |
| JP | 2004-79162 | 3/2004 |

OTHER PUBLICATIONS

Office Action issued Jan. 14, 2011, in Japan Patent Application No. 2008-244454 (with English translation).
Takashi Ohsawa, et al., "Design of a 128-Mb SOI DRAM Using the Floating Body Cell (FBC)", IEEE Journal of Solid-State Circuits, vol. 41, No. 1, Jan. 2006, pp. 135-145.
Takashi Ohsawa, et al., "An 18.5ns 128Mb SOI DRAM with a Floating Body Cell", IEEE International Solid-State Circuits Conference, 2005, 3 pages.

* cited by examiner

*Primary Examiner* — Anh Phung
(74) *Attorney, Agent, or Firm* — Oblon, Spivak, McClelland, Maier & Neustadt, L.L.P.

(57) ABSTRACT

A memory may includes: word lines; bit lines; memory array blocks including memory cells, each memory array block being a unit of a data read operation or a data write operation; a row decoder configured to selectively drive the word lines; sense amplifiers configured to detect data; and an access counter provided for each memory cell block, the access counter counting the number of times of accessing the memory array blocks in order to read data or write data, and activating a refresh request signal when the number of times of access reaches a predetermined number of times, wherein during an activation period of the refresh request signal of the access counter, the row decoder periodically and sequentially activates the word lines of the memory array blocks corresponding to the access counter, and the sense amplifier performs a refresh operation of the memory cells connected to the activated word lines.

19 Claims, 10 Drawing Sheets

SECOND EMBODIMENT

SEMICONDUCTOR MEMORY DEVICE

CROSS-REFERENCE TO RELATED APPLICATION

This application is based upon and claims the benefit of priority from the prior Japanese Patent Applications No. 2008-244454, filed on Sep. 24, 2008, the entire contents of which are incorporated herein by reference.

BACKGROUND OF THE INVENTION

1. Field of the Invention

The present invention related to a semiconductor memory device.

2. Related Art

Regardless of whether a memory is a volatile memory or a nonvolatile memory, disturbance occurs in data of unselected memory cells at a data reading time or at a data writing time. For example, at the time of detecting data of a selected memory cell connected to a selected word line, a potential of a bit line connected to a sense amplifier is also applied to unselected memory cells connected to unselected word lines. In this case, data stored in the unselected memory cells is disturbed by the potential of the bit line. The disturbance is a phenomenon of degrading data stored in the unselected memory cells at the time of accessing the selected memory cell. Disturbance is one of causes of decreasing a signal difference between data "0" and data "1". In a volatile memory, a signal difference between data "0" and data "1" is gradually degraded even during a data holding time having no access.

To solve this degradation of data due to a disturbance characteristic and a data holding characteristic, a refresh operation is performed. The refresh operation is an operation of recovering data from data degraded at a data holding time or recovering data from data degraded by disturbance.

However, access by data reading or data writing is performed irregularly. Therefore, the refresh operation to solve the problem of disturbance needs to be performed frequently irrespective of actual access frequency by taking the worst case into consideration. This causes increase of power consumption.

SUMMARY OF THE INVENTION

A semiconductor memory device according to an embodiment of the present invention comprises: a plurality of word lines; a plurality of bit lines; memory array blocks including memory cells provided corresponding to intersections between the word lines and the bit lines, each memory array block being a unit of a data read operation or a data write operation; a row decoder configured to selectively drive the word lines; sense amplifiers configured to detect data from the memory cells or to write data into the memory cells via the bit lines; and an access counter provided for each memory cell block, the access counter being configured to count the number of times of accessing the memory array blocks in order to read data or write data, and being configured to activate a refresh request signal when the number of times of access reaches a predetermined number of times, wherein during an activation period of the refresh request signal of the access counter, the row decoder periodically and sequentially activates the word lines of the memory array blocks corresponding to the access counter, and the sense amplifier performs a refresh operation of recovering data from degraded data of the memory cells connected to the activated word lines.

DETAILED DESCRIPTION OF THE INVENTION

Embodiments of the present invention will be explained below in detail with reference to the accompanying drawings. Note that the invention is not limited thereto.

First Embodiment

Figure 1:
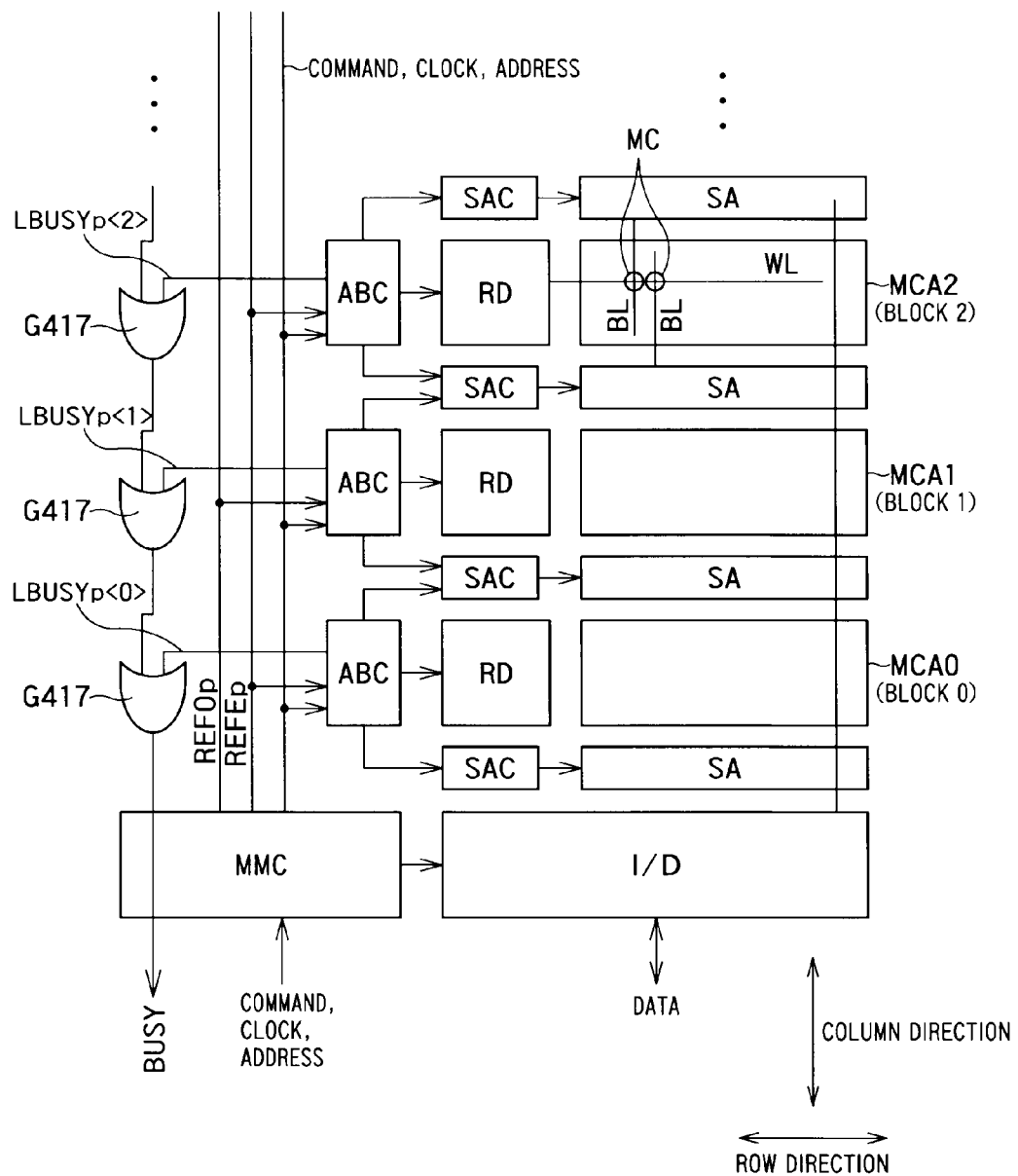
FIG. 1 is a block diagram showing a configuration of an FBC memory according to a first embodiment.

FIG. 1 is a block diagram showing a configuration of an FBC (Floating Body Cell) memory according to a first embodiment of the present invention. An FBC memory is configured by a FET (Field Effect Transistor) comprising floating bodies on a SOI (Silicon On Insulator) substrate and stores data "1" and/or data "0" in each memory cell by the number of carriers accumulated in the body. The FBC memory includes plural bit lines BL, plural word lines WL, and memory cell arrays as memory cell blocks. FIG. 1 shows three memory cell arrays MCA0 to MCA2 out of all memory cell arrays. The bit lines BL and the word lines WL are orthogonal with each other. Plural memory cells MC are provided corresponding to intersections between the bit lines BL and the word lines WL. Plural memory cells MC constitute the memory cell arrays MCA0 to MCA2 two dimensionally arranged in a matrix shape. The memory cell arrays MCA0 to MCA2 are units of a data read operation or a data write operation. Therefore, in the data read operation or the data write operation (hereinafter, also "access"), data stored in a memory cell array MCAi (i is an integer) is read out as one unit, or write data is written using the memory cell array MCAi as one unit.

Row decoders RD are connected to the word lines WL extended in a row direction. Each row decoder RD selects a word line WL following a local row address received at an access time, and activates the selected word line WL.

Sense amplifiers SA are connected to the bit lines BL. The sense amplifiers SA detect data from the memory cells MC via the bit lines BL, or write data into the memory cells MC.

Data of the memory cells MC connected to the selected word line WL are transmitted to the sense amplifiers SA via the bit lines BL connected to the memory cells MC. The sense amplifiers SA detect data of these memory cells MC.

Sense amplifier controllers SAC control the sense amplifiers SA for each memory cell array MCAi. The sense amplifier controllers SAC select a certain column following a column address input at the access time, and transmit data latched by the sense amplifier SA of a selected column to an input and output circuit I/O. To decrease a chip area, the sense amplifiers SA and the sense amplifier controllers SAC are sometimes shared by mutually adjacent two memory cell arrays MCA.

An array block controller ABC is provided for each memory cell array MCAi, and controls the row decoder RD and the sense amplifier SA corresponding to each memory cell array MCAi following the row address and the column address input at the access time.

A memory macro controller MMC receives a command, an address, and a clock from the outside, and delivers these signals to the array block controllers ABC. The array block controllers ABC activate the sense amplifier controller SAC and the row decoders RD of a corresponding block based on an address from the memory macro controller MMC. The activated sense amplifier controller SAC cause the sense amplifier SA to perform a read operation or a write operation according to a command. The row decoder RD and the sense amplifier SA perform the read operation or the write operation based on a clock. The clock (CLK) is a pulse signal which determines a timing of a read operation, a write operation, or a refresh operation.

The memory macro controller MMC also controls the input and output circuit I/O to exchange data between the memory and the outside. The input and output circuit I/O is configured to output data of the selected memory cell MC to the outside of the memory upon receiving control from the memory macro controller MMC or to receive write data from the outside of the memory and deliver this data to the sense amplifier SA of the selected column.

The memory macro controller MMC delivers signals REFOp and REFEp to the array block controller ABC. The signals REFOp and REFEp are the signals for prescribing a refresh cycle. When the signal REFOp is in the active state, for example, the array block controller ABC corresponding to odd blocks (2n+1) operates, and the memory cell array MCA (2n+1) is refreshed. In this case, n represents an integer. When the signal REFEp is in the active state, the array block controller ABC corresponding to even blocks 2n operates, and the memory cell array MCA (2n) is refreshed.

In a refresh operation, the array block controller ABC activates a local busy signal LBUSYp<i>. An OR gate G417 activates a busy signal BUSY when any one of the array block controllers ABC is in the active state. With this arrangement, when any one of the memory cell arrays MCA is refreshed, other access can be rejected.

Activation means to "turn on" or "drive an element or a circuit", and inactivation means to "turn off" or "suspend an element or a circuit". Therefore, a signal of HIGH (a high potential level) can be an activation signal, and a signal of LOW (a low potential level) can be an activation signal. For example, an NMOS transistor is activated by setting a gate to HIGH. On the other hand, a PMOS transistor is activated by setting a gate to LOW.

Figure 2:
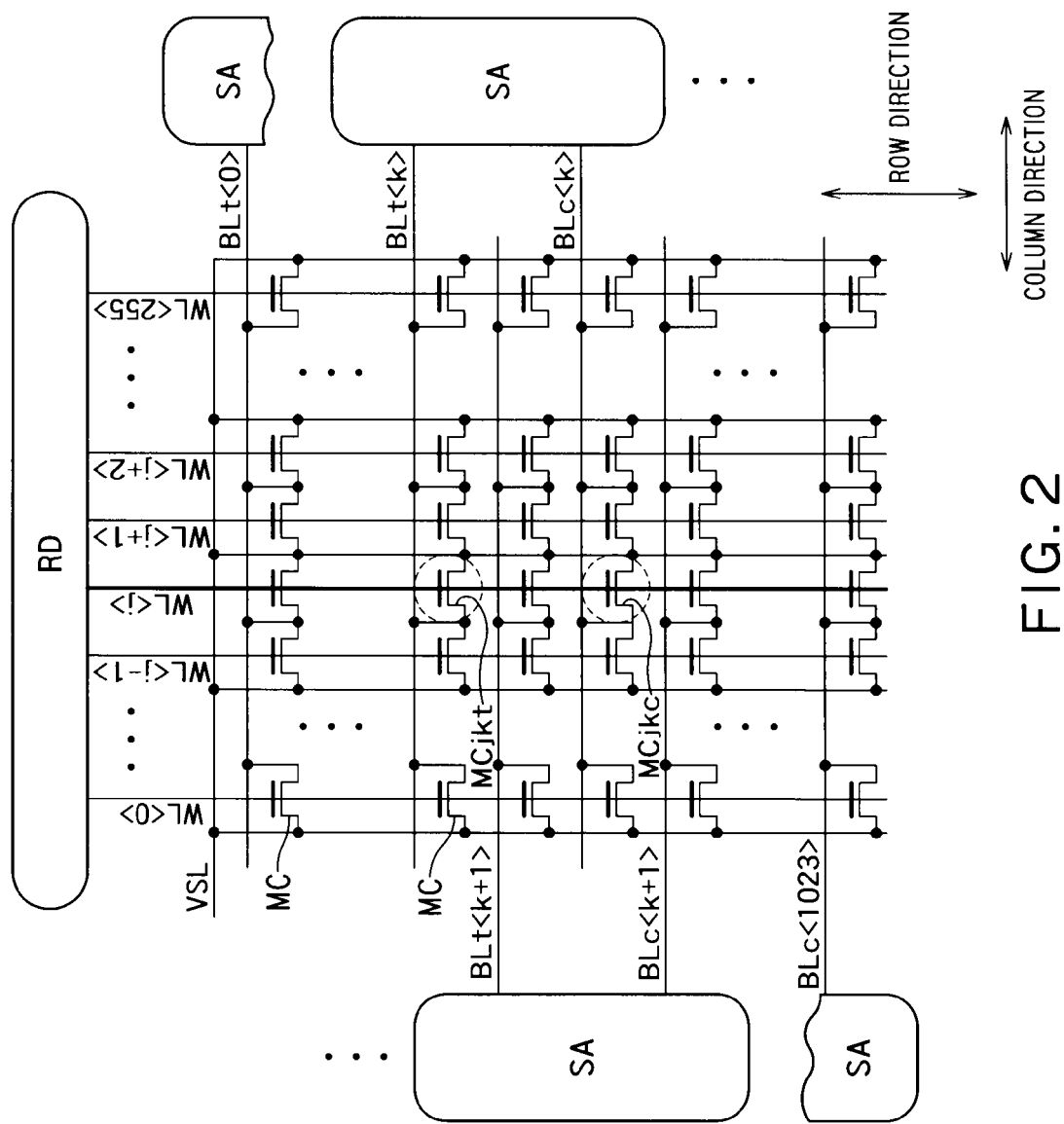
FIG. 2 is a schematic diagram showing a configuration of the memory cell array MCAi and peripheral units thereof.

FIG. 2 is a schematic diagram showing a configuration of the memory cell array MCAi and peripheral units thereof. In the first embodiment, bit lines BLt<k> and BLc<k> constitute a bit line pair. In this case, k=0 to 1023, for example. Word lines are provided by 256 including WL0 to WL255.

The bit lines BLt<k> and BLc<k> transmit mutually complementary data. The FBC memory according to the first embodiment employs a two-cell/bit system. In the two-cell/bit system, two memory cells MC store mutually complementary data, and one of the data is detected by using the other data as reference data. The memory cell MC is configured by a single FET. Therefore, even when the FBC memory uses the two-cell/bit system, a chip size is more advantageous than that of a DRAM and the like.

When memory cells MCjkt and MCjkc are selected, the row decoder RD activates the word line WLj. Mutually complementary data ("0", "1") are written in the memory cells MCjkt, MCjkc. Therefore, the complementary data are transmitted to the bit line pair BLt<k> and BLc<k>. The sense amplifier SA detects data transmitted to BLc<k> by using data transmitted to BLt<k> as reference data, and detects data transmitted to BLt<k> by using data transmitted to BLc<k> as reference data.

In FIG. 2, cell blocks corresponding to 256 bits×1024≅56 kilobits are used for the memory cell array MCA. However, a data capacity of the memory cell array MCA can be equal to or larger than 256 kilobits, or can be equal to or smaller than 256 kilobits.

Figure 3:
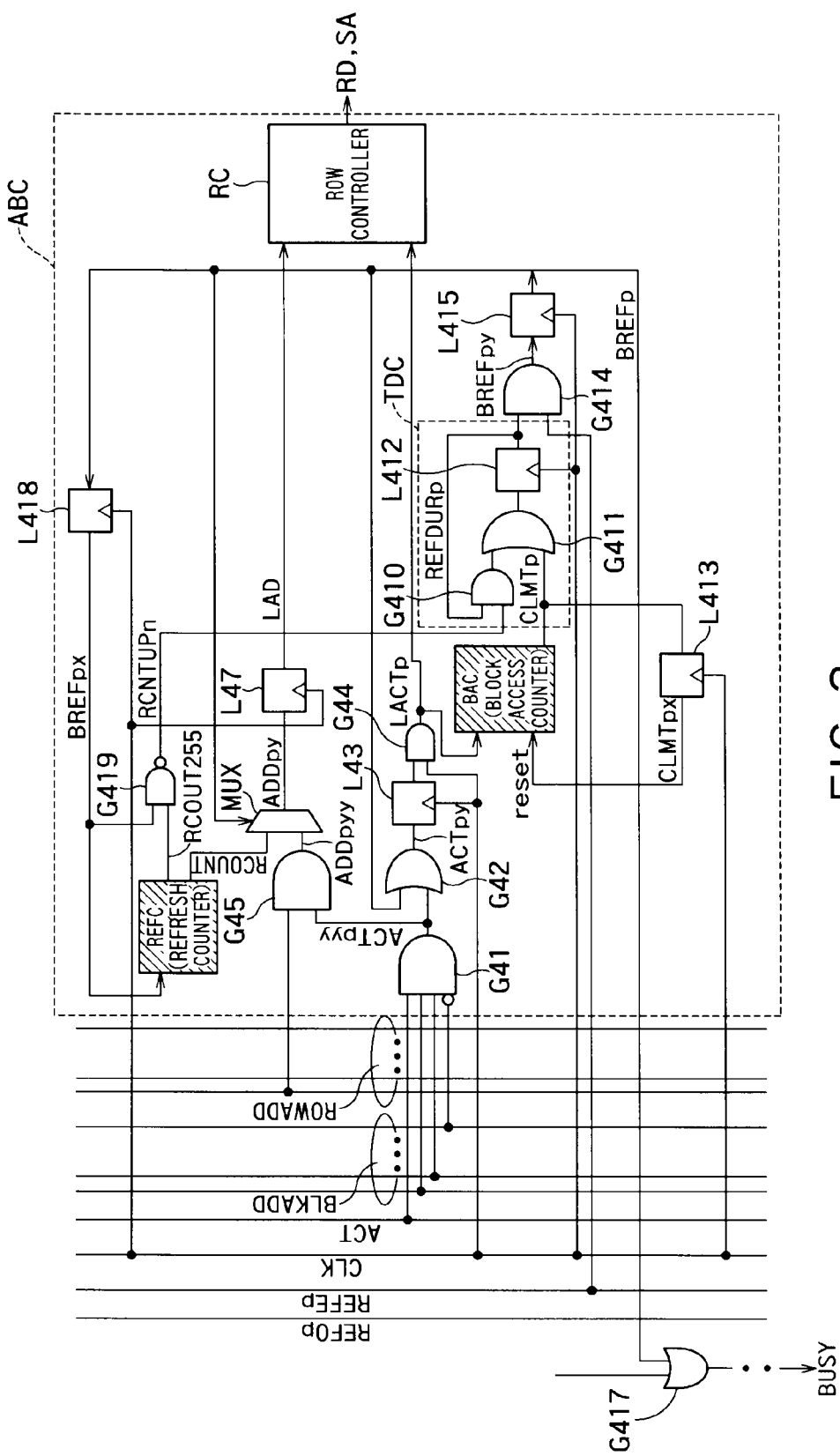
FIG. 3 is a block diagram showing one example of an internal configuration of the array block controller ABC.

FIG. 3 is a block diagram showing one example of an internal configuration of the array block controller ABC. FIG. 3 shows the array block controller ABC of even blocks (2n) that receives a refresh signal of REFEp. The array block controller ABC of odd blocks can be easily estimated from FIG. 3, and therefore, explanations thereof will be omitted. The array block controller ABC includes a block access counter BAC and a refresh counter REFC.

The refresh counter REFC counts the number of times of refresh performed to each word line WL. For example, at the time of refreshing the memory cell array MCA in the order of the word lines WL0 to WL255, the refresh counter REFC increments the number of times of refresh by one each time when the memory cell MC connected to one word line WL is refreshed. When the number of times of refresh becomes 256, a refresh operation of the total memory cell array MCA is completed. In this case, the refresh counter REFC can be said to count an address number of the word line WL to be refreshed.

The refresh operation is an operation of recovering logic data of the memory cell MC from degraded logic data.

The block access counter BAC counts the number of times of access to the memory cell array MCA corresponding to the array block controller ABC. For example, at the time of accessing the memory cell array MCA in the data read operation, the data write operation, and the refresh operation, the block access counter BAC increments by one the number of times of access held in the block access counter BAC. The access is an operation of activating the word line of an occasional and optional address. When the number of times of access reaches a predetermined number of times, the block access counter BAC activates a signal BREFp as a refresh instruction signal. After activating the signal BREFp, the block access counter BAC starts a refresh operation in the next cycle.

As explained above, when the number of times of access to a corresponding memory cell array MCA reaches a predetermined number of times, the array block controller ABC performs the refresh operation, and controls the row decoder RD and the sense amplifier SA to refresh the total memory cell array MCA. That is, the array block controller ABC is configured to perform the refresh operation depending on the number of times of access.

The configuration of the array block controller ABC is explained in further detail. An AND gate G41 receives a block address BLKADD and an activation signal ACT allocated to each block. When the block address BLKADD is a predetermined address, the AND gate G41 activates a signal ACTpyy. The AND gate G41 has a different configuration for each block following the block address BLKADD. With this arrangement, the AND gate G41 can select the memory cell array MCA of a specific block shown by the block address BLKADD, at an activation timing of the signal ACT. In this way, the AND gate G41 functions as a decoder of the block address BLKADD.

An OR gate G42 receives activation of a signal ACTppy or the signal BREFp, and activates the signal ACTpy. After activating the signal ACTpy, a latch circuit L43 and an AND gate G44 output the signal ACTpy as a signal LACTp in the next cycle. A row controller RC is activated by activating the signal LACTp. Accordingly, access to the memory cell array MCA is performed following a local row address LAD.

The signal LACTp is also input to the block access counter BAC. The signal LACTp is activated synchronously with a clock signal CLK. Therefore, the block access counter BAC counts the number of times of activation (the number of times of starting) of the signal LACTp. Accordingly, the number of times of access can be counted.

When the number of times of access reaches a predetermined value, a signal CLMTp as a refresh request signal is activated. A refresh-period determination circuit TDC (hereinafter, also "determination circuit TDC") receives activation of the signal CLMTp, and activates a refresh-period determination signal REFDURp. An AND gate G414 periodically passes the signal REFDURp based on the signal BREFp that prescribes a refresh cycle. A latch circuit L415 determines a pulse width of the signal BREFp based on the clock signal CLK. That is, the AND gate G414 determines a timing of activating the signal BREFp, and the latch circuit L415 determines an activation period (a pulse width) of the signal BREFp. Accordingly, the signal BREFp has the same width as that of the clock signal CLK, and becomes a pulse signal activated in each refresh cycle (condition 1). The refresh cycle is a period from the activation of a certain word line WLj to the activation of the next word line WLj+1.

A latch circuit 412 as a feedback circuit feeds back the signal REFDURp to an AND gate G410. The AND gate G410 passes the signal REFDURp until a signal RCNTUPn from the refresh counter REFC is activated to a logic low. The signal RCNTUPn maintains an inactive state (a logic high) during a refresh period (for example, a period from when the number of times of refresh is zero until when this number becomes 254). When the number of times of refresh reaches a predetermined value (255, for example), the signal RCNTUPn becomes in an active state.

After the number of times of access reaches a predetermined value and after the block access counter BAC activates the signal CLMTp (after entering a refresh operation), in the next refresh cycle, a latch circuit 413 resets the number of times of access stored in the block access counter BAC. However, once the signal CLMTp is activated, the determination circuit TDC latches the signal REFDURp in the active state. This latch state by the determination circuit TDC is maintained until the signal RCNTUPn showing an end of the refresh period is activated to the logic low. That is, the signal REFDURp is activated when the signal CLMTp is activated, and the signal REFDURp is maintained in the active state until a series of refresh period of the total memory cell array MCA ends. Accordingly, the signal BREFp can be activated during the refresh period (condition 2).

When the condition 1 and the condition 2 are combined together, the signal BREFp is a pulse signal activated for each refresh cycle (each time when REFEp is activated) during a refresh period (a period while REFDURp is activated).

The signal BREFp is transferred as the signal BREFpx to the refresh counter REFC via a latch circuit L418. The refresh counter REFC counts the number of pulses of the signal BREFpx (the signal BREFp). The refresh counter REFC transmits the number of times of refresh to a multiplexer MUX as a signal RCOUNT. The latch circuit L418 counts the number of times of refresh in the next cycle after activating the refresh instruction signal BREFp. Accordingly, the refresh counter REFC can output the next address each time when refresh of one word line WL is finished.

The multiplexer MUX outputs the signal RCOUNT when the signal BREFp is in the active state, and outputs a signal ADDpyy when the signal BREFp is in the inactive state. That is, at a refresh time, the multiplexer MUX outputs the signal RCOUNT as ADDpy to sequentially select the word lines WL. In this case, a row address ROWADD showing a selected word line WL is in an invalid state. In operations other than the refresh operation, the multiplexer MUX outputs the signal ADDpyy showing the row address ROWADD as ADDpy.

A latch circuit L47 latches the output signal ADDpy of the multiplexer MUX synchronously with the clock signal CLK. The latch circuit L47 transfers the output signal ADDpy to the row controller RC as a local row address LAD based on the clock CLK. In the refresh operation, the local row address LAD is a signal showing the number of times of refresh.

A signal RCOUNT255 from the refresh counter REFC is input to an AND gate G419. The AND gate G419 outputs as a signal RCNTUPn a result of a NAND calculation of the signal BREFpx and the signal RCOUNT255. The signal BREFpx is the signal BREFp synchronized with the clock signal CLK. The signal RCOUNT255 is activated when the number of times of refresh reaches a predetermined value (255, for example). Accordingly, the signal RCNTUPn is activated to the logic low when the number of times of refresh reaches the predetermined value, and is inactivated to the logic high in other cases. The signal RCNTUPn as an end determination signal shows an end of a refresh period, and the activated signal REFDURp is reset to the inactive state.

The row decoder RD sequentially activates the word lines WL for each refresh cycle based on the local row address LAD. The sense amplifier SA recovers data from degraded data in the memory cell MC connected to the activated word line WL. After the refresh request signal CLMTp is activated, RCOUNT is zero in the first refresh cycle. Zero is output as the local row address LAD, and the word line WL0 is selected. Thereafter, RCOUNT is incremented each time when the signal BREFp is activated (at each refresh cycle). Word lines are selected in the order of WL1, WL2, WL3, and so on. After ending the refresh, the AND gate G414 sets REFEp to the inactive state until when the number of times of access reaches a predetermined value.

The signal BREFp is also transferred to the OR gate 417. The OR gate 417 outputs the busy signal BUSY by activating the signal BREFp. While the busy signal BUSY is in the active state, access from the outside of the memory is prohibited.

In FIG. 3, only one bit is shown for the AND gate G45, the multiplexer MUX, the refresh counter REFC, and the latch circuit 47, respectively. However, actually, these units are provided by only the number of bits of the row address ROW- ADD. For example, when there are 256 word lines WL, the AND gate G45, the multiplexer MUX, the refresh counter REFC, and the latch circuit 47 are provided by eight bits, respectively.

Figure 4:
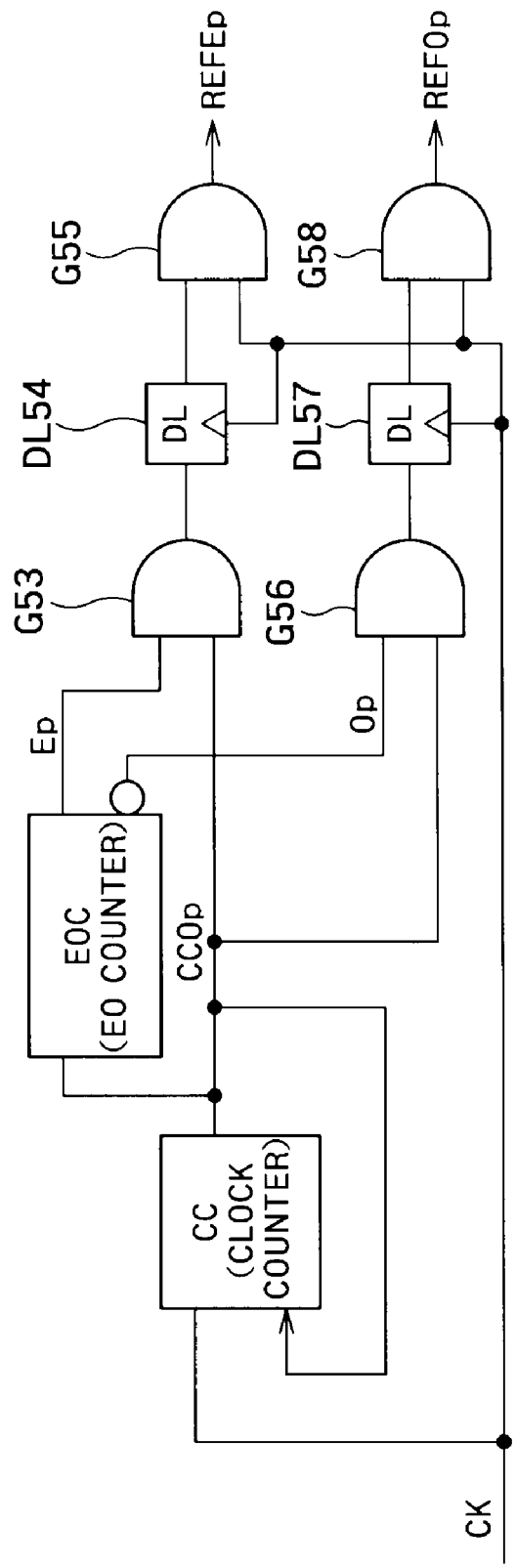
FIG. 4 is a block diagram showing a partial configuration of the macro memory control MMC.

FIG. 4 is a block diagram showing a partial configuration of the macro memory control MMC. FIG. 4 shows a circuit that generates the signals REFEp and REFOp. A clock counter CC counts the clock signal CLK, and activates a signal CCOp at each time of receiving a predetermined number of clocks. An EO counter EOC alternately activates signals Ep and Op synchronously with the clock signal CLK.

An AND gate G53 receives the signals Ep and CCOp, and outputs a logic state of the signal Ep at each activation of the signal CCOp. A D latch circuit DL54 and an AND gate G55 output the signal Ep as the signal REFEp synchronously with the clock signal CLK.

An AND gate G56 receives the signals Op and CCOp, and outputs a logic state of the signal Op at each activation of the signal CCOp. A D latch circuit DL57 and an AND gate G58 output the signal Op as the signal REFOp synchronously with the clock signal CLK.

The D latch circuits DL54 and DL57 latch an input signal when the clock CLK is at the logic high, and pass the latched signal when the clock CLK is at the logic low. Therefore, each time when the number of clocks reaches a predetermined value, only either signals REFEp or REFOp is activated during only a period of one clock.

Figure 5:
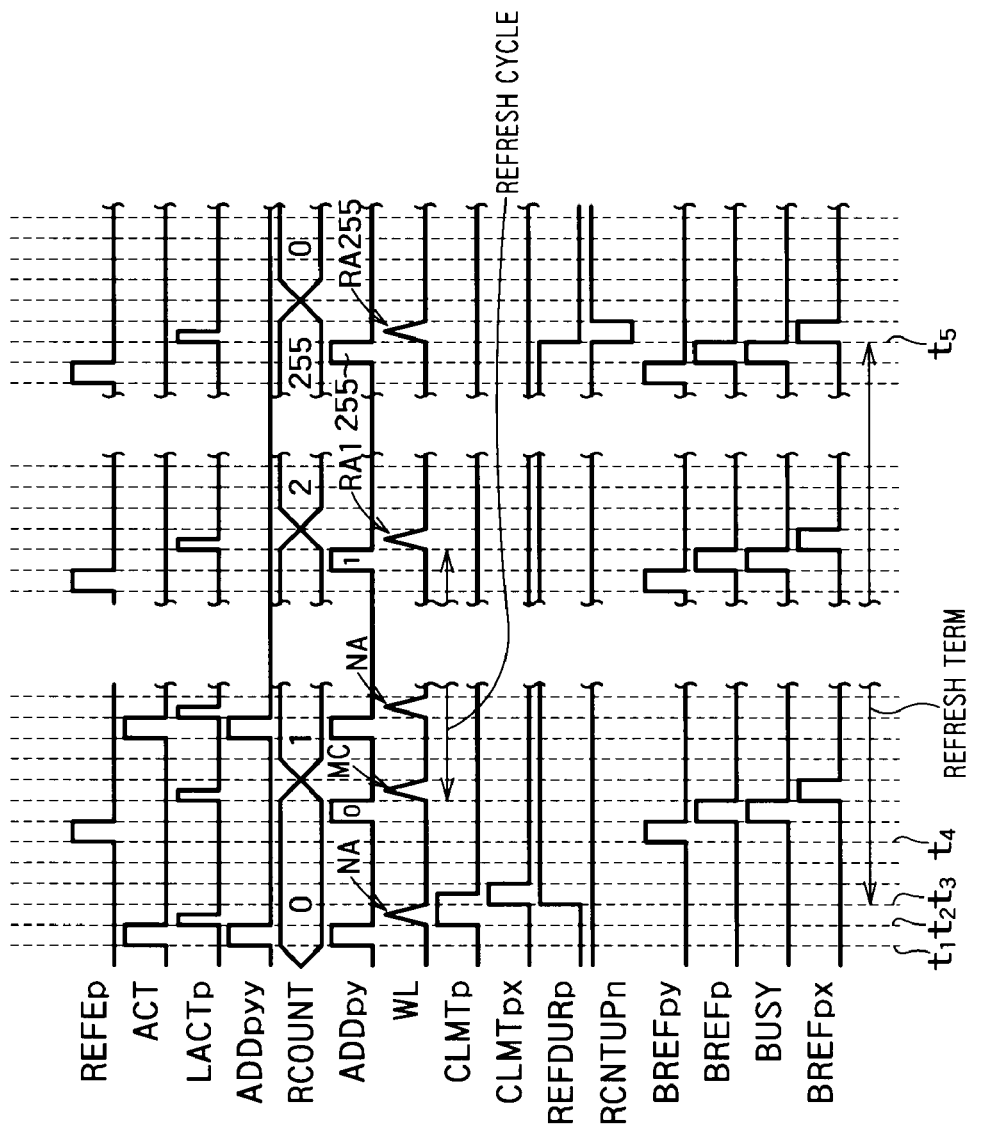
FIG. 5 is a timing diagram showing a detailed example of an operation of the FBC memory according to the first embodiment.

FIG. 5 is a timing diagram showing a detailed example of an operation of the FBC memory according to the first embodiment. An interval between broken lines in FIG. 5 shows a cycle (3 ns, for example) of the clock signal CLK.

[Data Reading, Data Writing (Normal Operation)]

At time t1, a data read instruction or a data write instruction is input. Accordingly, the block activation signal ACT is activated. The AND gate G41 of a block shown by a block address activates the signal ACTpyy. Along the activation of the signal ACTpyy, the AND gate G45 passes the row address ROW-ADD. Along the activation of the signal ACTpyy, the signal LACTp is activated at the next clock. The signal LACTp is latched by the latch circuit L43.

In the normal operation, the refresh instruction BREFp is in the inactive state (the logic low). Therefore, the multiplexer MUX outputs the signal ADDpyy as ADDpy. Accordingly, the latch circuit L47 outputs a local row address to the row controller RC as the signal LAD. Consequently, the row controller RC selects the word line WL specified by the row address ROWADD, and can perform either the read operation or the write operation.

By activating the signal LACTp, the block access counter BAC increments the number of times of access by one.

[Refresh Operation]

When the number of times of access reaches a predetermined value, the refresh request signal CLMTp is activated at t2 as shown. The signal REFDURp and a signal CLMTpx are activated at t3 one clock after t2. The latch circuits L412 and L413 delay operations of the signal REFDURp and the signal CLMTpx by one clock, respectively from the refresh request signal CLMTp. The latch circuit L412 latches the active state of the signal REFDURp. A period during which the signal REFDURp is active is a refresh period.

For the signal CLMTpx to reset the number of times of access of the block access counter BAC, the signal CLMTp is inactivated immediately after the signal CLMTpx is activated. Because the signal REFEp is not yet activated at this time, any actual refresh operation is not performed yet. The number of times of refresh (the signal RCOUNT) of the refresh counter REFC remains zero.

At t4, the signal REFEp is activated. The signal REFEp is activated in each refresh cycle. The AND gate G414 passes the signal REFDURp in each refresh cycle. Therefore, the signal BREFpy and the refresh instruction BREFp are activated. The latch circuit L415 activates the refresh instruction BREFp one clock after the signal BREFpy. Substantially simultaneously with the activation of the refresh instruction BREFp, the busy signal BUSY is activated, thereby prohibiting access from the outside.

The multiplexer MUX receives the signal BREFp, and outputs the signal RCOUNT as the signal ADDpy. At this time, RCOUNT is zero, and therefore, ADDpy becomes zero. Accordingly, zero is output as the local row address LAD, and the word line WL0 is selected.

The signal BREFpx is activated further one clock after the refresh instruction BREFp (simultaneously with the activation of the word line WL0 or immediately after this). Accordingly, the refresh counter REFC increments the number of times of refresh by one.

When the number of the word lines WL is 256, the refresh operation is repeated until when the number of times of refresh becomes equal to the number of the word lines WL.

At t5, when the number of times of refresh reaches 256, the refresh counter REFC activates the signal RCOUNT255. Accordingly, the signal RCNTUPn is activated to the logic low. Consequently, the refresh request signal REFDURp is inactivated, and the refresh period ends.

In FIG. 5, active states RA0 to RA255 of the word line WL show access (refresh access) by the refresh operation. NA denotes access (normal access) by the normal reading or writing. When the refresh operation is performed (when the busy signal BUSY is in the active state), access by the normal reading or writing is prohibited. However, in the refresh period, when the refresh operation is not performed (when the busy signal BUSY is in the inactive state), access by the normal reading or writing can be performed.

Figure 6:
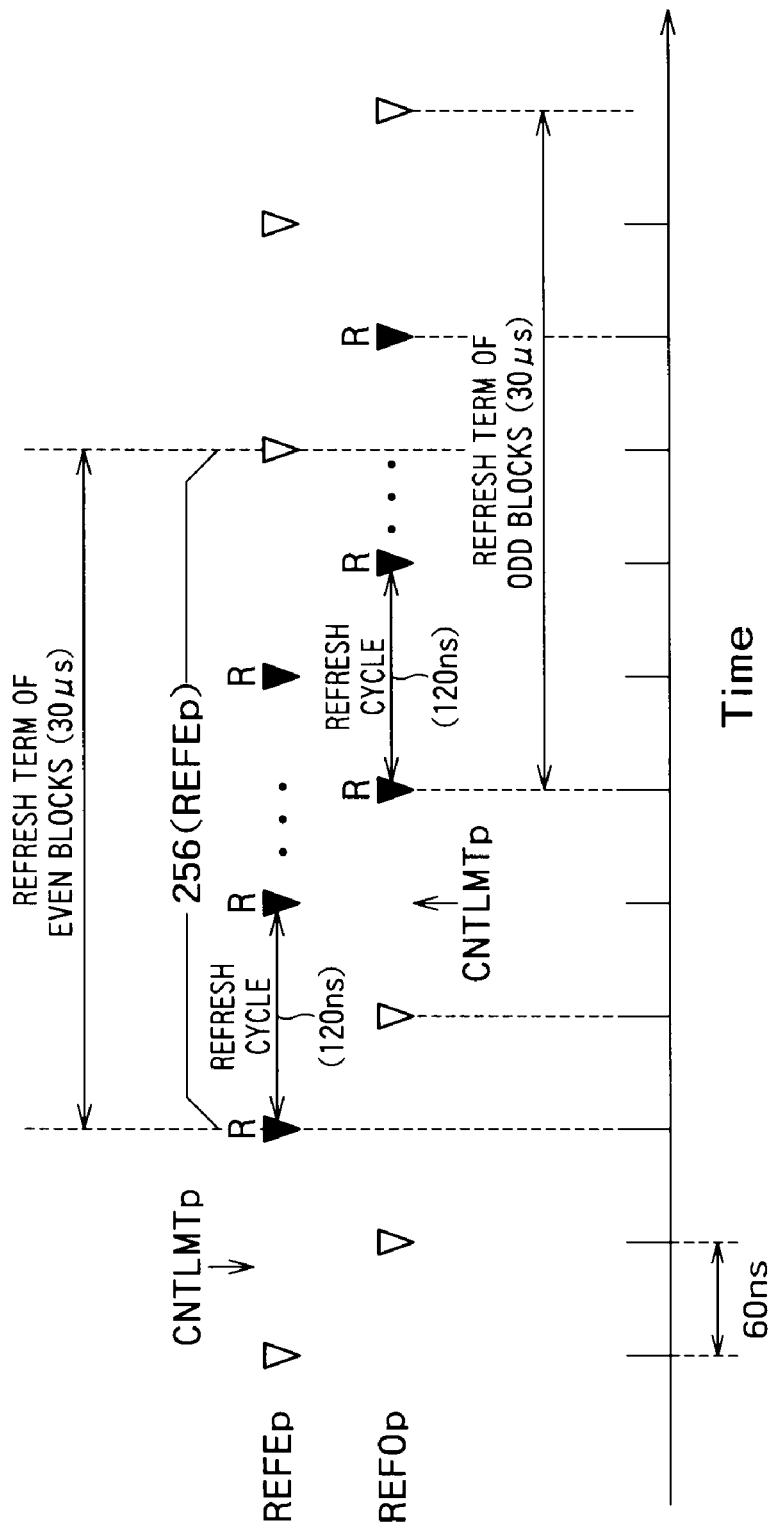
FIG. 6 is a timing diagram showing an activation cycle of REFEp and REFOp to determine a refresh cycle.

FIG. 6 is a timing diagram showing an activation cycle of REFEp and REFOp to determine a refresh cycle. In the first embodiment, a starting cycle of the clock signal CLK is 3 ns. The signals REFEp and REFOp are alternately activated at each 60 ns. That is, the clock counter CC shown in FIG. 4 activates the signal CCOp by one clock period at each time of receiving 20 clock signals CLK. Accordingly, the signal REFEp is activated by one clock period at each 120 ns, and the signal REFOp is also activated by one clock period at each 20 ns.

Each mark of the black-out triangle indicates an actual operation of the refresh cycle. Each mark of the outlined triangle indicates a cycle when the refresh cycle is not operated actually because the refresh request signal REFDURp is inactivated.

A refresh operation of the memory cell array MCA of an even address and a refresh operation of the memory cell array MCA of an odd address are performed in a state that the refresh cycle is shifted by a half cycle. Therefore, even when the memory cell array MCA of an even address and the memory cell array MCA of an odd address share the sense amplifier SA, the refresh operation can be performed without delay.

Figure 7:
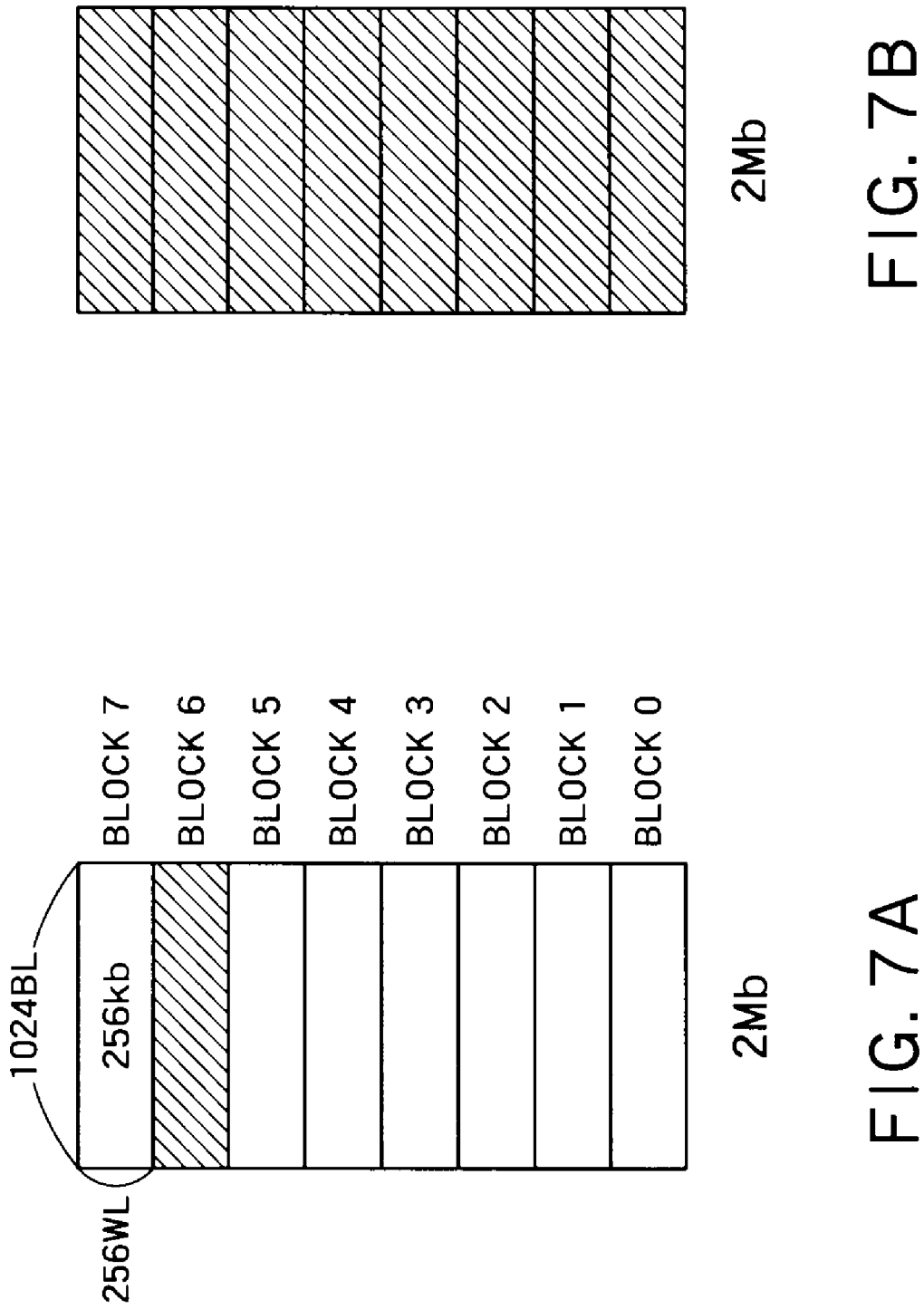
FIGS. 7A and 7B are schematic diagrams showing a refresh busy rate of the FBC memory according to the first embodiment.

FIGS. 7A and 7B are schematic diagrams showing a refresh busy rate of the FBC memory according to the first embodiment. For example, each memory cell array MCA has eight cell arrays provided with 1024 bit lines BL and 256 word lines WL. In this case, memory capacity of each memory cell array MCA has about two megabits.

It takes about 30.72 μs (256×120 ns) to perform a refresh operation of a memory cell array of a certain block. In the refresh period, when the busy signal BUSY is in the inactive state, access of the normal operation can be performed. Therefore, in the refresh period, when access is concentrated in a certain word line WL, the maximum number of times of access becomes about 10,240 (=30.72 µs/3 ns). Even when the next refresh period starts after ending a certain refresh period, the word lines WL are refreshed in the order of addresses. Accordingly, the word line WL in which access is concentrated is not always refreshed immediately. Consequently, to avoid occurrence of a data failure due to disturbance, a permissible number of times of access of the memory cell MC needs to be the maximum number of times of access or more accessed during two refresh periods. In this example, the maximum number of times of access during two refresh periods is about 20,480.

To solve the above problem, the conventional FBC memory performs the refresh operation by using the two refresh periods as one period (60 µs). That is, the conventional FBC memory controls performance of the refresh operation by time. This is performed to avoid the occurrence of a data failure due to disturbance, by considering the worst case that access is concentrated in a certain memory cell array MCA. In the case of the conventional technique, the memory cell array MCA needs to be refreshed in a predetermined period (60 µs). In this example, a busy rate is 2.56% (512×3 ns/60 µs). Because odd blocks and even blocks are refreshed at separate timings, when the number of word lines is 256, a refresh cycle within the refresh period is 512 times.

On the other hand, the FBC memory according to the first embodiment counts the number of times of access for each block, and performs the refresh operation based on this number of times of access. In this case, when the number of times of access reaches the maximum number of times of access (about 10,240, in this example) during the refresh period, the refresh period is started.

When access is concentrated in only the block 6 as shown in FIG. 7A, for example, the number of times of access of the block access counter BAC corresponding to the block 6 reaches about 10,240 during the refresh period (30 µs). Therefore, immediately after ending a certain refresh period of the block 6, the next access period is started. However, other blocks 0 to 5 and 7 are not refreshed. Consequently, power consumption becomes a quarter of that in the conventional example. In this case, a busy rate becomes 5.120% (512/10,240).

As shown in FIG. 7B, when access is uniformly performed to each block, the number of times of access to each block reaches about 10,240 during eight refresh periods (240 µs). Therefore, power consumption becomes a quarter of that of the conventional example. A busy rate becomes one half of that of the example shown in FIG. 7A. Therefore, a busy rate of the example shown in FIG. 7B becomes 0.640%.

When the number of blocks of the memory cell array is larger, an effect of the first embodiment is more exhibited. When the number of blocks is 64, as shown in FIG. 7A, when access is concentrated in one block, power consumption becomes 1/32 of that of the conventional example. When access is performed uniformly to each block as shown in FIG. 7B, power consumption is one quarter of that of the conventional example, and is not different from power consumption when the number of blocks is eight.

In the first embodiment, the block access counter BAC counts the number of times of access of reading or writing for each memory cell array MCA as a unit block of a data read operation or a data write operation. In the first embodiment, a refresh operation is performed for each memory cell array MCA according to the number of times of access. That is, in the first embodiment, a period of the refresh operation is controlled by the number of times of access. Accordingly, power consumption can be decreased. When access is dispersed to plural blocks without being concentrated in a single memory cell array MCA, a refresh busy rate decreases.

In the first embodiment, a period of the refresh operation can be combined with that of the conventional example for controlling the period by time. A control system based on the number of times of access can prevent a data failure due to disturbance. A control system based on time can prevent a retention failure at a data holding time. Accordingly, an FBC memory having higher reliability can be provided.

Second Embodiment

Figure 8:
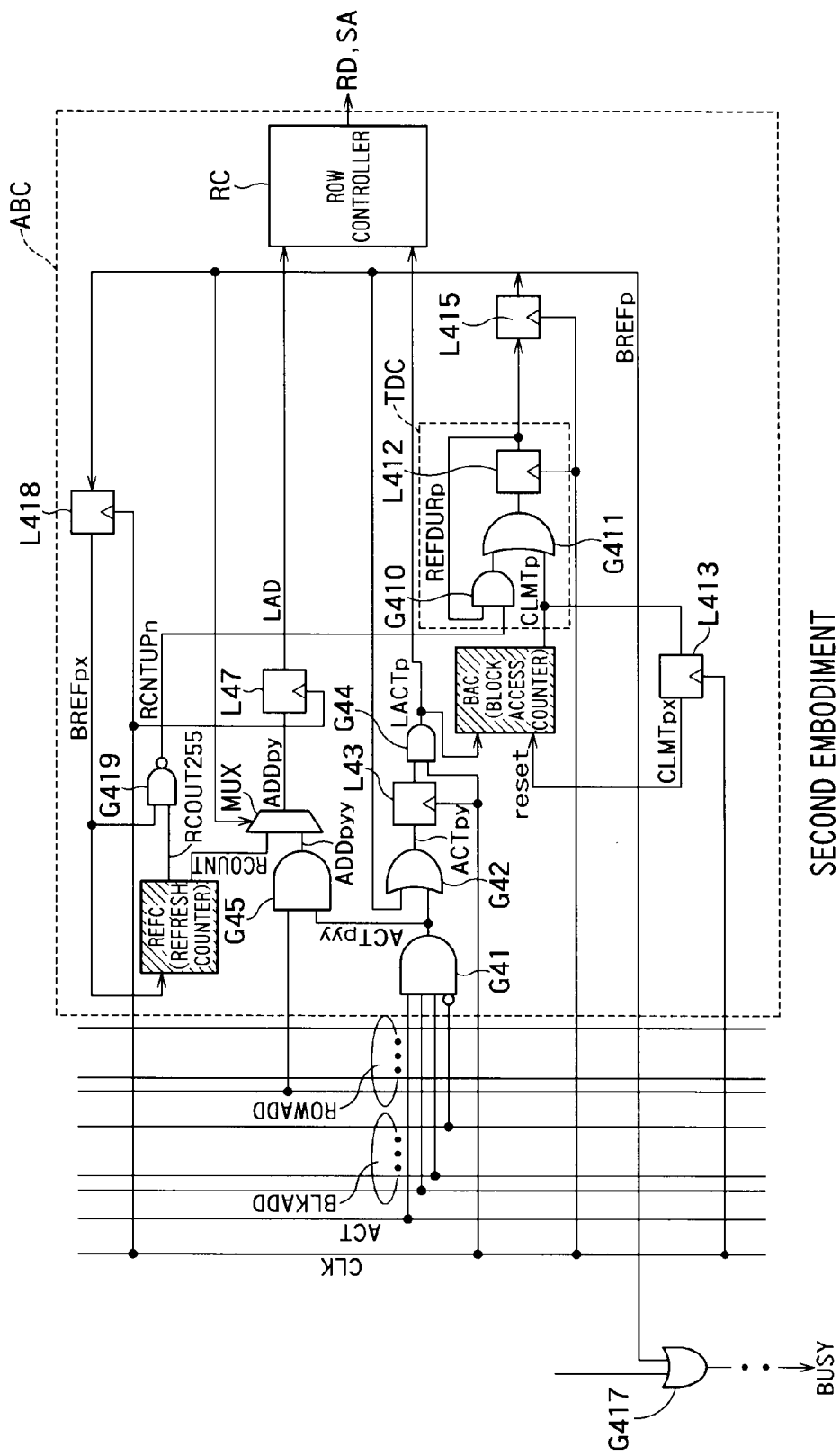
FIG. 8 is a block diagram showing a configuration of the array block controller ABC according to a second embodiment.

FIG. 8 is a block diagram showing a configuration of the array block controller ABC according to a second embodiment of the present invention. The second embodiment is different from the first embodiment in that the AND gate G414 is not provided in the second embodiment. Other configurations of the second embodiment can be similar to those of the first embodiment. Therefore, in the second embodiment, when the number of times of access reaches a predetermined value, the word lines WL within this memory cell array MCA are continuously selected and a refresh operation is performed, without depending on the signals REFEp and REFOp. In this case, the word lines WL are continuously driven in the order of addresses by matching a continuous series of clock signals CLK, and the memory cells MC connected to the word lines WL are refreshed.

Figure 9:
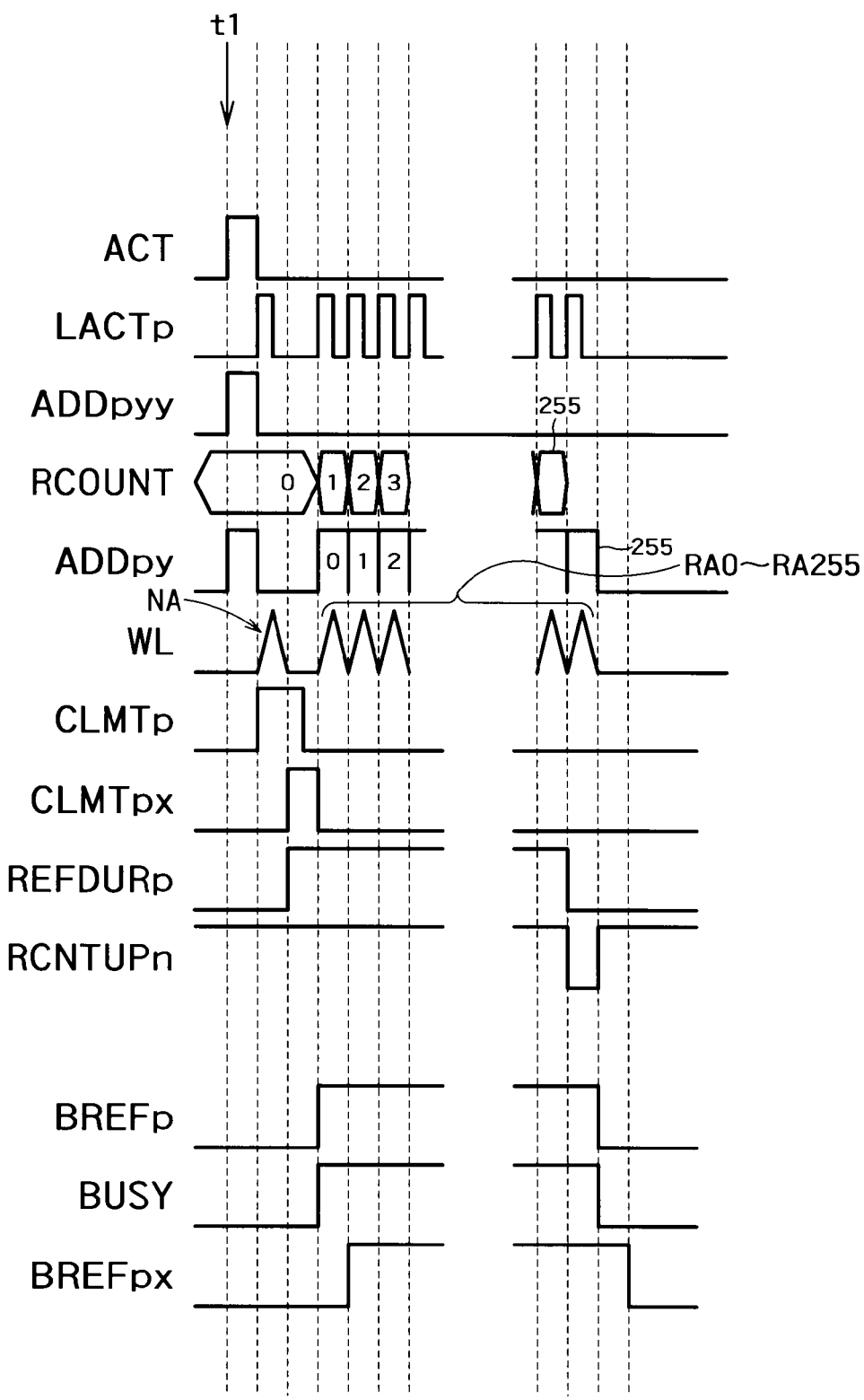
FIG. 9 is a timing diagram showing a detailed example of an operation of the FBC memory according to the second embodiment.

FIG. 9 is a timing diagram showing a detailed example of an operation of the FBC memory according to the second embodiment. An interval between broken lines in FIG. 9 shows a cycle (3 ns, for example) of the clock signal CLK in a similar manner to that in FIG. 5.

The normal operation is as explained with reference to FIG. 5. Among activation peaks of the word lines WL shown in FIG. 9, the normal access NA shows access at the reading or writing time in the normal operation. Other refresh accesses RA0 to RA255 are those at a refresh time.

In the second embodiment, the refresh accesses RA0 to RA255 are continuously performed. During this substantially whole continuous refresh period, the refresh instruction BREFp, the busy signal BUSY, and the signal BREFpx maintain the active state. That is, during substantially the whole period when the refresh request signal REFDURp is in the active state, the refresh instruction BREFp, the busy signal BUSY, and the signal BREFpx are also in the active state. However, timings of the refresh instruction BREFp, the busy signal BUSY, and the signal BREFpx are slightly shifted from the timing of the refresh request signal REFDURp. Therefore, these timings are not completely consistent.

Other operations of the second embodiment can be similar to those of the first embodiment.

Figure 10:
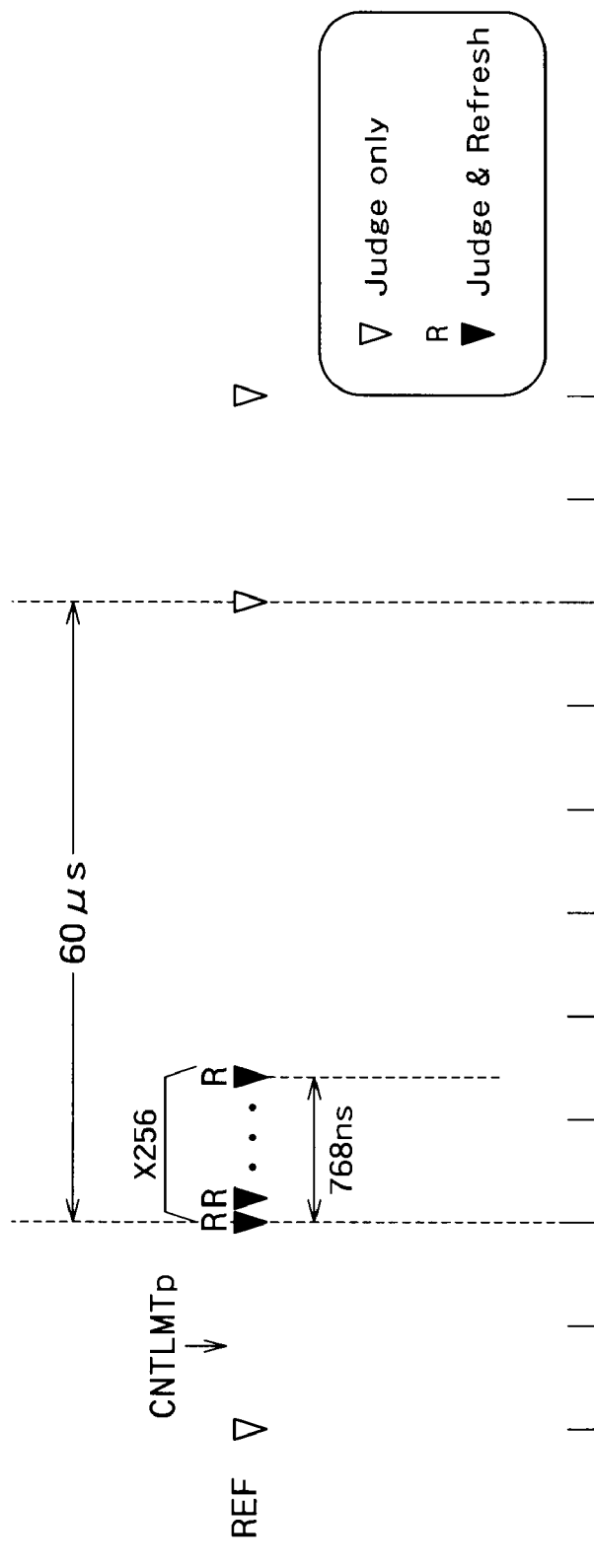
FIG. 10 is a timing diagram showing a refresh cycle in the second embodiment.

FIG. 10 is a timing diagram showing a refresh cycle in the second embodiment. Refresh is performed by matching a continuous series of clock signals CLK. When a width of the clock signal CLK is 30 ns and also when the number of word lines is 256, a refresh period of either odd blocks or even blocks becomes 768 ns. A refresh period of both the odd blocks and even blocks becomes 768 ns×2. During this refresh period, access of the normal operation is prohibited.

When the permissible number of times of access to the memory cells MC is 20,480, the number of times of access when the refresh request signal REFEDURp is activated can be 20,480. This is because refresh is performed continuously in the second embodiment. Therefore, a busy rate in the second embodiment becomes one half of that in the first embodiment. As a result, the busy rate in the second embodiment can be suppressed to equal to or lower than that of the conventional example.

The busy rate in the second embodiment is one half of that in the first embodiment means that power consumption in the second embodiment is also one half of that in the first embodiment. Therefore, power consumption in the second embodiment becomes ⅛ of that of the first embodiment.

While a two-cell/bit system is used in the above embodiments, one-cell/bit system can be also used. The one-cell/bit system is a system of transmitting information data from the memory cell MC to one of a bit line pair connected to the sense amplifier SA and transmitting reference data to the other bit line BL. The other bit line BL is not connected to the memory cell MC, and transmits reference data showing an intermediate state between the data "0" and the data "1".

The invention claimed is:

1. A semiconductor memory device comprising:
a plurality of word lines;
a plurality of bit lines;
memory array blocks including memory cells provided corresponding to intersections between the word lines and the bit lines, each memory array block being a unit of a data read operation or a data write operation;
a row decoder configured to selectively drive the word lines;
sense amplifiers configured to detect data from the memory cells or to write data into the memory cells via the bit lines; and
an access counter provided for each memory cell block, the access counter being configured to count the number of times of accessing the memory array blocks in order to read data or write data, and being configured to activate a refresh request signal when the number of times of access reaches a predetermined number of times, wherein
during an activation period of the refresh request signal of the access counter, the row decoder periodically and sequentially activates the word lines of the memory array blocks corresponding to the access counter, and the sense amplifier performs a refresh operation of recovering data from degraded data of the memory cells connected to the activated word lines.

2. The device of claim 1, wherein the number of times of accessing the memory array blocks is the number of times of activating a word line within the memory cell block.

3. The device of claim 1, further comprising a feedback circuit configured to reset the number of times of access according to activation of the refresh request signal.

4. The device of claim 2, further comprising a feedback circuit configured to reset the number of times of access according to activation of the refresh request signal.

5. The device of claim 1, further comprising a refresh counter configured to count the number of times of refresh cycles performed for each of the word lines in the refresh operation of a certain memory array block, wherein
when the number of times of the refresh cycles reaches a predetermined value, the refresh counter inactivates the refresh request signal in order to end the refresh operation.

6. The device of claim 2, further comprising a refresh counter configured to count the number of times of refresh cycles performed for each of the word lines in the refresh operation of a certain memory array block, wherein
when the number of times of the refresh cycles reaches a predetermined value, the refresh counter inactivates the refresh request signal in order to end the refresh operation.

7. The device of claim 3, further comprising a refresh counter configured to count the number of times of refresh cycles performed for each of the word lines in the refresh operation of a certain memory array block, wherein
when the number of times of the refresh cycles reaches a predetermined value, the refresh counter inactivates the refresh request signal in order to end the refresh operation.

8. The device of claim 1, further comprising a refresh counter configured to count the number of the word lines refreshed in the refresh operation of a certain memory array block, wherein
when the number of the word lines refreshed in the certain memory array block reaches a predetermined value, the refresh counter inactivates the refresh request signal in order to end the refresh operation.

9. The device of claim 2, further comprising a refresh counter configured to count the number of the word lines refreshed in the refresh operation of a certain memory array block, wherein
when the number of the word lines refreshed in the certain memory array block reaches a predetermined value, the refresh counter inactivates the refresh request signal in order to end the refresh operation.

10. The device of claim 1, further comprising a gate circuit provided corresponding to the memory array blocks, the gate circuit being configured to receive a refresh instruction activated when the refresh operation is performed for each of the word lines, and to output a busy signal prohibiting access to the memory cells to the outside of the device when the refresh instruction is in an active state.

11. The device of claim 2, further comprising a gate circuit provided corresponding to the memory array blocks, the gate circuit being configured to receive a refresh instruction activated when the refresh operation is performed for each of the word lines, and to output a busy signal prohibiting access to the memory cells to the outside of the device when the refresh instruction is in an active state.

12. The device of claim 3, further comprising a gate circuit provided corresponding to the memory array blocks, the gate circuit being configured to receive a refresh instruction activated when the refresh operation is performed for each of the word lines, and to output a busy signal prohibiting access to the memory cells to the outside of the device when the refresh instruction is in an active state.

13. The device of claim 1, further comprising a gate circuit configured to receive the refresh request signal and a cycle signal prescribing a refresh cycle performed for each of the word lines, and to output a refresh instruction activated for each refresh cycle in order to perform the refresh operation to each of the word lines.

14. The device of claim 2, further comprising a gate circuit configured to receive the refresh request signal and a cycle signal prescribing a refresh cycle performed for each of the word lines, and to output a refresh instruction activated for each refresh cycle in order to perform the refresh operation to each of the word lines.

15. The device of claim 1, wherein when the refresh request signal is activated, the row decoder continuously activates the word lines of the memory array blocks corresponding to the access counter, and the sense amplifier performs the refresh operation to the activated word lines.

16. The device of claim 1, wherein the sense amplifier is shared by a plurality of adjacent memory array blocks, and the refresh operation is alternately performed to even-order memory array blocks and odd-order memory array blocks.

17. The device of claim 2, wherein the sense amplifier is shared by a plurality of adjacent memory array blocks, and the refresh operation is alternately performed to even-order memory array blocks and odd-order memory array blocks.

18. The device of claim 8, wherein the sense amplifier is shared by a plurality of adjacent memory array blocks, and the refresh operation is alternately performed to even-order memory array blocks and odd-order memory array blocks.

19. The device of claim 16, wherein the refresh operation of each of the word lines of the even-order memory array blocks is performed by shifting a half cycle of a refresh cycle performed to each of the word lines from the refresh operation of each of the word lines of the odd-order memory array blocks.

* * * * *